United States Patent
Nedachi

(10) Patent No.: US 8,169,247 B2
(45) Date of Patent: May 1, 2012

(54) MULTIPHASE CLOCK GENERATION CIRCUIT

(75) Inventor: Takaaki Nedachi, Tokyo (JP)

(73) Assignee: NEC Corporation, Tokyo (JP)

( * ) Notice: Subject to any disclaimer, the term of this patent is extended or adjusted under 35 U.S.C. 154(b) by 45 days.

(21) Appl. No.: 12/888,207

(22) Filed: Sep. 22, 2010

(65) Prior Publication Data

US 2011/0102028 A1    May 5, 2011

(30) Foreign Application Priority Data

Oct. 29, 2009 (JP) ................. 2009-248432

(51) Int. Cl.
    *H03H 11/16*      (2006.01)
(52) U.S. Cl. ............ 327/231; 327/170; 327/234
(58) Field of Classification Search ......... 327/170, 327/231–235
See application file for complete search history.

(56) References Cited

U.S. PATENT DOCUMENTS

2004/0119511 A1*   6/2004   Stark et al. ............. 327/112
2010/0054760 A1*   3/2010   Fukuda ................... 398/202

OTHER PUBLICATIONS

"Phase Interpolator Based CDR", [online], Rambus, [searched on Oct. 26, 2009], the Internet <URL: http://www.rambus.com/jp/patents/innovations/detail/phase_interpolator.html>.
W. J. Dally et al "Digital Systems Engineering. Advanced", Maruzen Co. Ltd., Mar. 30, 2003, pp. 759-761.

* cited by examiner

*Primary Examiner* — An Luu

(57) ABSTRACT

The multiphase clock generation circuit includes a variable slew rate circuit and a phase interpolation circuit. In the variable slew rate circuit, the slew rate varies according to a first control signal. Two reference clocks having a phase difference of 90° from each other are supplied to the phase interpolation circuit via the variable slew rate circuit. The phase interpolation circuit interpolates the two reference clocks having a phase difference of 90° from each other according to a second control signal to thereby generate an output clock having an intermediate phase.

16 Claims, 18 Drawing Sheets

FIG. 11

| STEP | PHASE SELECTOR SELC [*] | | | | PI SELP [*] | | | | | | | | | | | | | | | | PHASE [deg] |
|---|---|---|---|---|---|---|---|---|---|---|---|---|---|---|---|---|---|---|---|---|---|
| | 3 | 2 | 1 | 0 | 15 | 14 | 13 | 12 | 11 | 10 | 9 | 8 | 7 | 6 | 5 | 4 | 3 | 2 | 1 | 0 | |
| 0/64 | 0 | 0 | 1 | 1 | 0 | 0 | 0 | 0 | 0 | 0 | 0 | 0 | 0 | 0 | 0 | 0 | 0 | 0 | 0 | 0 | 0 |
| 1/64 | 0 | 0 | 1 | 1 | 0 | 0 | 0 | 0 | 0 | 0 | 0 | 0 | 0 | 0 | 0 | 0 | 0 | 0 | 0 | 1 | |
| 2/64 | 0 | 0 | 1 | 1 | 0 | 0 | 0 | 0 | 0 | 0 | 0 | 0 | 0 | 0 | 0 | 0 | 0 | 0 | 1 | 1 | |
| 3/64 | 0 | 0 | 1 | 1 | 0 | 0 | 0 | 0 | 0 | 0 | 0 | 0 | 0 | 0 | 0 | 0 | 0 | 1 | 1 | 1 | |
| 4/64 | 0 | 0 | 1 | 1 | 0 | 0 | 0 | 0 | 0 | 0 | 0 | 0 | 0 | 0 | 0 | 0 | 1 | 1 | 1 | 1 | |
| 5/64 | 0 | 0 | 1 | 1 | 0 | 0 | 0 | 0 | 0 | 0 | 0 | 0 | 0 | 0 | 0 | 1 | 1 | 1 | 1 | 1 | |
| 6/64 | 0 | 0 | 1 | 1 | 0 | 0 | 0 | 0 | 0 | 0 | 0 | 0 | 0 | 0 | 1 | 1 | 1 | 1 | 1 | 1 | |
| 7/64 | 0 | 0 | 1 | 1 | 0 | 0 | 0 | 0 | 0 | 0 | 0 | 0 | 0 | 1 | 1 | 1 | 1 | 1 | 1 | 1 | |
| 8/64 | 0 | 0 | 1 | 1 | 0 | 0 | 0 | 0 | 0 | 0 | 0 | 0 | 1 | 1 | 1 | 1 | 1 | 1 | 1 | 1 | |
| 9/64 | 0 | 0 | 1 | 1 | 0 | 0 | 0 | 0 | 0 | 0 | 0 | 1 | 1 | 1 | 1 | 1 | 1 | 1 | 1 | 1 | |
| 10/64 | 0 | 0 | 1 | 1 | 0 | 0 | 0 | 0 | 0 | 0 | 1 | 1 | 1 | 1 | 1 | 1 | 1 | 1 | 1 | 1 | |
| 11/64 | 0 | 0 | 1 | 1 | 0 | 0 | 0 | 0 | 0 | 1 | 1 | 1 | 1 | 1 | 1 | 1 | 1 | 1 | 1 | 1 | |
| 12/64 | 0 | 0 | 1 | 1 | 0 | 0 | 0 | 0 | 1 | 1 | 1 | 1 | 1 | 1 | 1 | 1 | 1 | 1 | 1 | 1 | |
| 13/64 | 0 | 0 | 1 | 1 | 0 | 0 | 0 | 1 | 1 | 1 | 1 | 1 | 1 | 1 | 1 | 1 | 1 | 1 | 1 | 1 | |
| 14/64 | 0 | 0 | 1 | 1 | 0 | 0 | 1 | 1 | 1 | 1 | 1 | 1 | 1 | 1 | 1 | 1 | 1 | 1 | 1 | 1 | |
| 15/64 | 0 | 0 | 1 | 1 | 0 | 1 | 1 | 1 | 1 | 1 | 1 | 1 | 1 | 1 | 1 | 1 | 1 | 1 | 1 | 1 | |
| 16/64 | 0 | 0 | 1 | 1 | 1 | 1 | 1 | 1 | 1 | 1 | 1 | 1 | 1 | 1 | 1 | 1 | 1 | 1 | 1 | 1 | |
| 16/64 | 0 | 1 | 1 | 0 | 1 | 1 | 1 | 1 | 1 | 1 | 1 | 1 | 1 | 1 | 1 | 1 | 1 | 1 | 1 | 1 | 90 |
| 17/64 | 0 | 1 | 1 | 0 | 0 | 1 | 1 | 1 | 1 | 1 | 1 | 1 | 1 | 1 | 1 | 1 | 1 | 1 | 1 | 1 | |
| 18/64 | 0 | 1 | 1 | 0 | 0 | 0 | 1 | 1 | 1 | 1 | 1 | 1 | 1 | 1 | 1 | 1 | 1 | 1 | 1 | 1 | |
| 19/64 | 0 | 1 | 1 | 0 | 0 | 0 | 0 | 1 | 1 | 1 | 1 | 1 | 1 | 1 | 1 | 1 | 1 | 1 | 1 | 1 | |
| ⋮ | ⋮ | | | | ⋮ | | | | | | | | | | | | | | | | |
| 31/64 | 0 | 1 | 1 | 0 | 0 | 0 | 0 | 0 | 0 | 0 | 0 | 0 | 0 | 0 | 0 | 0 | 0 | 0 | 0 | 1 | |
| 32/64 | 0 | 1 | 1 | 0 | 0 | 0 | 0 | 0 | 0 | 0 | 0 | 0 | 0 | 0 | 0 | 0 | 0 | 0 | 0 | 0 | |
| 32/64 | 1 | 1 | 0 | 0 | 0 | 0 | 0 | 0 | 0 | 0 | 0 | 0 | 0 | 0 | 0 | 0 | 0 | 0 | 0 | 0 | 180 |
| 33/64 | 1 | 1 | 0 | 0 | 0 | 0 | 0 | 0 | 0 | 0 | 0 | 0 | 0 | 0 | 0 | 0 | 0 | 0 | 0 | 1 | |
| 34/64 | 1 | 1 | 0 | 0 | 0 | 0 | 0 | 0 | 0 | 0 | 0 | 0 | 0 | 0 | 0 | 0 | 0 | 0 | 1 | 1 | |
| ⋮ | ⋮ | | | | ⋮ | | | | | | | | | | | | | | | | |
| 45/64 | 1 | 0 | 0 | 0 | 0 | 1 | 1 | 1 | 1 | 1 | 1 | 1 | 1 | 1 | 1 | 1 | 1 | 1 | 1 | 1 | |
| 46/64 | 1 | 1 | 0 | 0 | 1 | 1 | 1 | 1 | 1 | 1 | 1 | 1 | 1 | 1 | 1 | 1 | 1 | 1 | 1 | 1 | |
| 46/64 | 1 | 0 | 0 | 1 | 1 | 1 | 1 | 1 | 1 | 1 | 1 | 1 | 1 | 1 | 1 | 1 | 1 | 1 | 1 | 1 | 270 |
| 47/64 | 1 | 0 | 0 | 1 | 0 | 1 | 1 | 1 | 1 | 1 | 1 | 1 | 1 | 1 | 1 | 1 | 1 | 1 | 1 | 1 | |
| ⋮ | ⋮ | | | | ⋮ | | | | | | | | | | | | | | | | |
| 62/64 | 1 | 0 | 0 | 1 | 0 | 0 | 0 | 0 | 0 | 0 | 0 | 0 | 0 | 0 | 0 | 0 | 0 | 0 | 1 | 1 | |
| 63/64 | 1 | 0 | 0 | 1 | 0 | 0 | 0 | 0 | 0 | 0 | 0 | 0 | 0 | 0 | 0 | 0 | 0 | 0 | 0 | 1 | |
| 0/64 | 1 | 0 | 0 | 1 | 0 | 0 | 0 | 0 | 0 | 0 | 0 | 0 | 0 | 0 | 0 | 0 | 0 | 0 | 0 | 0 | |
| 0/64 | 0 | 0 | 1 | 1 | 0 | 0 | 0 | 0 | 0 | 0 | 0 | 0 | 0 | 0 | 0 | 0 | 0 | 0 | 0 | 0 | 0 |
| 1/64 | 0 | 0 | 1 | 1 | 0 | 0 | 0 | 0 | 0 | 0 | 0 | 0 | 0 | 0 | 0 | 0 | 0 | 0 | 0 | 1 | |

⌐ ¬
⌊ ⌋ : PHASE SWITCHING TIMING

Slew-rate=MAX

Slew-rate=MIN

Related Art

Related Art

MULTIPHASE CLOCK GENERATION CIRCUIT

INCORPORATION BY REFERENCE

This application is based upon and claims the benefit of priority from Japanese patent application No. 2009-248432, filed on Oct. 29, 2009, the disclosure of which is incorporated herein in its entirety by reference.

TECHNICAL FIELD

The present invention relates to a multiphase clock generation circuit for generating one or more clocks having arbitrary phases from a plurality of reference clocks of a fixed phase.

BACKGROUND ART

In order to transmit and receive digital signals between LSIs, it is necessary to determine each data bit on the receiving side at a correct time. As such, a signal line for transmitting timing signals (clock signals) is often provided, besides a signal line for transmitting data. However, as it is necessary to provide a timing signal line along a date signal line, an area to be used on a substrate increases. As such, in recent high-speed serial transmission or the like, a timing signal line is eliminated, and a timing signal is superposed on a data signal and transmitted in the transmission side, while in the receiving side, edges of the data signal are detected and the phase of a reference clock is adjusted to thereby reproduce timing information. This process is generally called Clock Data Recovery (CDR), and a circuit provided to the receiving side for Clock Data Recovery is called a CDR circuit.

Main configuration methods of a CDR circuit include a phase-locked loop method, a ring oscillator method, and a phase interpolation method. While each method has advantages and disadvantages, a phase interpolation method is increasingly adopted recently, as the transmission speed is improved (for example, see "Phase Interpolator Based CDR" (Non-Patent Document 1)).

In the phase interpolation method, a CDR circuit generates one or more clocks of arbitrary phases through phase interpolation from a plurality of reference clocks having a fixed phase, and selects an optimum clock phase according to the timing of an edge or the like of a data signal. FIG. 15 is a block diagram showing an exemplary CDR circuit of a phase interpolation method.

Referring to FIG. 15, a CDR circuit 100 includes a multiphase clock generation circuit 110 incorporating a phase selection circuit and a phase interpolation circuit therein, a sampler 120, and a CDR controller 130. The sampler 120 uses a recovery clock generated by the multiphase clock generation circuit 110 to sample received serial data, and outputs an edge sample and a data sample. The CDR controller 130 determines an optimum phase of a clock for sampling serial data according to the edge sample and the data sample, and generates two types of control signals, which are a phase selection signal and a PI selection signal, in order to allow a recovery clock conforming to the determined phase to be generated by the multiphase clock generation circuit 110. The multiphase clock generation circuit 110 selects two sets of clocks, each of which includes two clocks having a phase difference of 90°, among four types of reference clocks of 0°, 90°, 180°, and 270°, according to the phase selection signal. Further, for the respective selected sets, the multiphase clock generation circuit 110 interpolates the two clocks of different phases to generate four clocks having phases determined by the PI selection signal, and outputs the generated clocks to the sampler 120 as recovery clocks.

FIG. 16 is a block diagram showing an example of the multiphase clock generation circuit 110. Referring to FIG. 16, the multiphase clock generation circuit 110 related to the present invention includes four clock input terminals IN0 to IN3, four buffer circuits 111-1 to 111-4, a phase selection circuit 112, two phase interpolation circuits 113-1 and 113-2, and four clock output terminals OUT0 to OUT3. To the clock input terminals IN0 to IN3, four types of reference clocks of 0°, 90°, 180°, and 270° are input. The reference clocks input to the respective clock input terminals IN0 to IN3 are branched into two by the buffer circuits 111-1 to 111-4, and are input as a system-0 input consisting of four types of reference clocks of 0°, 90°, 180°, and 270° and a system-1 input consisting of four types of reference clocks of 0°, 90°, 180°, and 270°, to the phase selection circuit 112. The phase selection circuit 112 selects two sets of clocks, each including two clocks having a phase difference of 90° from each other, from the system-0 input and the system-1 input by a 4-bit phase selection signal SELC[3.0], and outputs the sets to the phase interpolation circuits 113-1 and 113-2. The phase interpolation circuits 113-1 and 113-2 interpolate the input two clocks having a phase difference of 90° from each other, and outputs clocks of phases determined by a PI selection signal SELP[15:0] from the clock terminals OUT0 to OUT3.

The multiphase clock generation circuit 110 shown in FIG. 16 is able to control phases of output clocks at intervals of 5.6° (STEP) in a range of 360° according to combinations of input clocks by the phase selection signal SELC[3:0] and interpolation in the phase interpolation circuits 113-1 and 113-2 by the PI selection signal SELP[15:0].

Non-Patent Document 1: "Phase Interpolator Based CDR", [online], Rambus, [searched on Oct. 26, 2009], the Internet <URL: http://www.rambus.com/jp/patents/innovations/detail/phase_interpolator.html>

Non-Patent Document 2: "Digital Systems Engineering, Advanced", Mar. 30, 2003, Maruzen Co. Ltd., pp. 759-761

In order to accurately generates a clock of an intermediate phase from two input clocks having a phase difference of 90° at predetermined intervals with use of a phase interpolation circuit, it is necessary to optimize the transistor size (W/L) inside the phase interpolation circuit and a rise/fall time of a clock waveform to be input to the circuit according to the operating frequency, where W represents a channel width and L represents a channel length. However, it is difficult to optimize the phase interpolation circuit across the entire bandwidth of the operating frequency having a broad bandwidth.

As a measure to address the above problem, there is a compromise in which a phase interpolation circuit is optimized in a high operating frequency, and degradation of capability in low operating frequency is tolerated as not being avoidable. However, in general, when a phase interpolation circuit optimized at a particular operating frequency is used at a lower operating frequency, a phase difference becomes larger and so a waveform distortion becomes larger, whereby intervals between output clock phases become non-uniform. In the worst case, steps may be formed in a waveform of an output clock so as to cause a problem that jitter tolerance is reduced, for example. FIG. 17 shows a simulation result of waveforms of output clocks when an input clock of 5 GHz is input to a phase interpolation circuit optimized at an operating frequency of 5 GHz. Further, FIG. 18 shows a simulation result of waveforms of output clocks when an input clock of 2.5 GHz is input to the same phase interpolation circuit. In FIG. 18, it is found that distortions occur in the output clocks on the way of variation and steps are generated.

Further, as another measure to address the above problem, it may be possible to mount a plurality of phase interpolation circuits optimized at different operating frequencies on a multiphase clock circuit, and switch between the phase interpolation circuits to be used according to an operating frequency. However, this measure involves disadvantages such that the circuit area and the power consumption increase.

SUMMARY

An exemplary object of the present invention is to provide a multiphase clock generation circuit capable of solving a problem that it is difficult to use a phase interpolation circuit with high performance across the entire bandwidth of the operating frequency having a broad bandwidth.

According to an exemplary aspect of the present invention, a multiphase clock generation circuit includes a variable slew rate circuit in which the slew rate varies according to a first control signal, and a phase interpolation circuit which interpolates two reference clocks according to a second control signal, the two reference clocks having a phase difference of 90° from each other and being input to the phase interpolation circuit through the variable slew rate circuit, to thereby generate an output clock having an intermediate phase.

According to another exemplary aspect of the present invention, a multiphase clock generation method includes adjusting characteristics of rise and fall of waveforms of two reference clocks having a phase difference of 90° from each other; and interpolating the two adjusted reference clocks thereby generating an output clock having an intermediate phase.

As the present invention is configured as described above, it is possible to use a phase interpolation circuit in a wide operating frequency band with high performance.

BRIEF DESCRIPTION OF THE DRAWINGS

FIG. 11 is a table showing combination patterns of phase selection signals and PI selection signals used in the multiphase clock generation circuit of the present invention;

EXEMPLARY EMBODIMENT

Next, exemplary embodiments of the present invention will be described in detail with reference to the drawings.

First Exemplary Embodiment

Figure 1:
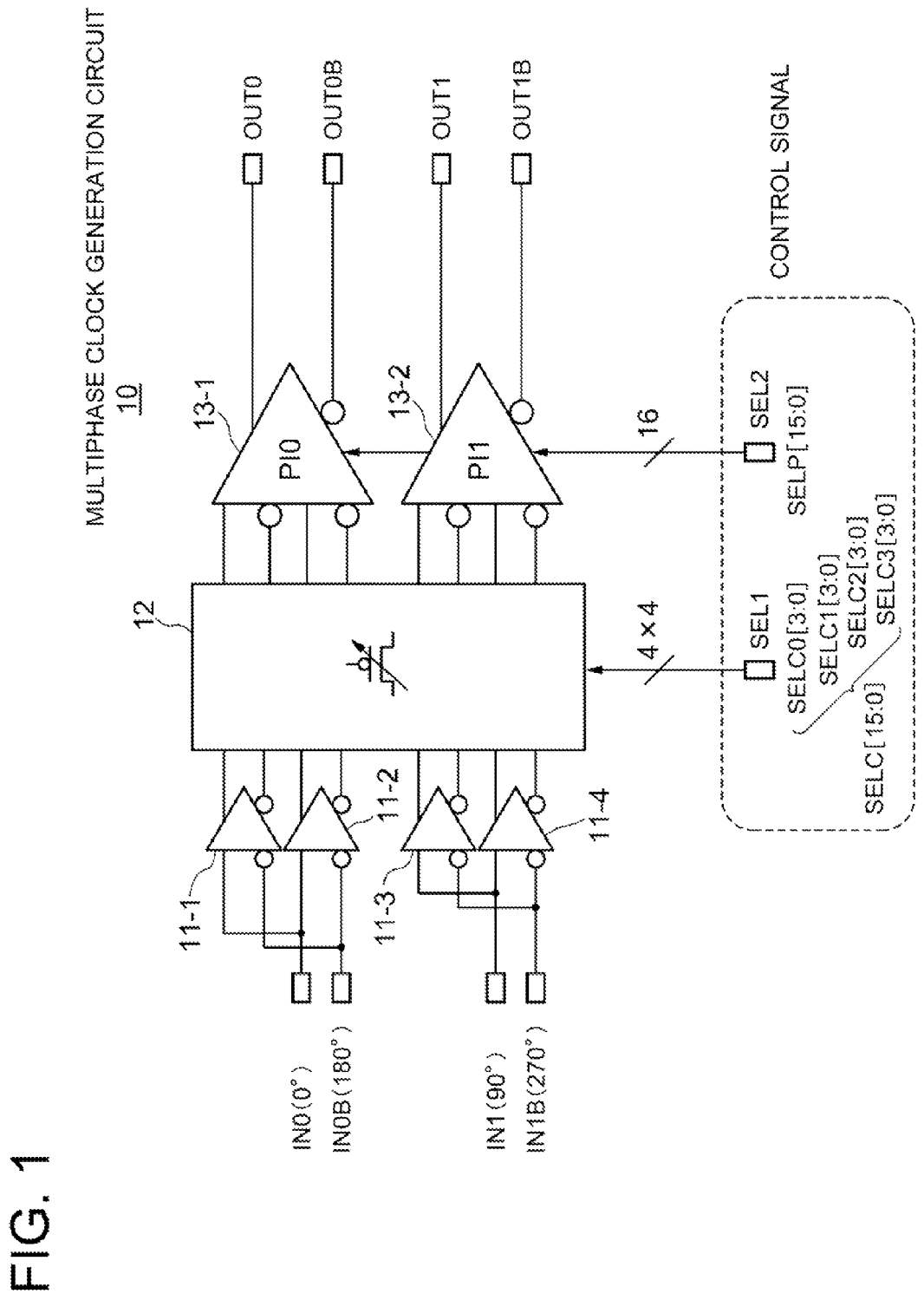
FIG. 1 is a block diagram showing an embodiment of a multiphase clock generation circuit of the present invention.

Referring to FIG. 1, a multiphase clock generation circuit 10 according to a first exemplary embodiment of the present invention includes four clock input terminals IN0, IN0B, IN1, and IN1B; four clock output terminals OUT0, OUT0B, OUT1, and OUT1B; two control terminals SEL1 and SEL2, four buffer circuits 11-1 to 11-4, a phase selection circuit 12; and two phase interpolation circuits 13-1 and 13-2.

To the clock input terminal IN0, a reference clock of a reference phase (hereinafter referred to as a reference clock of 0°) is input. To the clock input terminal IN0B, a reference clock delayed by 180° from the reference phase (hereinafter referred to as a reference clock of 180°) is input. To the clock input terminal IN1, a reference clock delayed by 90° (hereinafter referred to as a reference clock of 90°) is input. To the clock input terminal IN1B, a reference clock delayed by 270° from the reference phase (hereinafter referred to, as a reference clock of 270°) is input.

To the control terminal SEL1, a 16-bit phase selection signal SELC[15:0], for selecting a reference clock and for selecting a slew rate, is input. The 16-bit phase selection signal SELC[15:0] is composed of phase selection signals SELC0[3:0], SELC1[3:0], SELC2[3:0], and SELC3[3:0], each having 4 bits. The phase selection signal SELC[15:0] takes any one of the following:

(1) State 1
  SELC0[3:0]=at least one bit is 1
  SELC1[3:0]=at least one bit is 1
  SELC2[3:0]=every bit is 0
  SELC3[3:0]=every bit is 0

In this state, the number of bits taking 1 in SELC0[3:0] and SELC1[3:0] is the same. When SELC[15:0] is in State 1, it is represented as SELC[15:0]=(0011)$_i$, where i represents the number of bits taking 1 in SELC0[3:0] and SELC1[3:0].

(2) State 2
SELC0[3:0]=every bit is 0
SELC1[3:0]=at least one bit is 1
SELC2[3:0]=at least one bit is 1
SELC3[3:0]=every bit is 0

In this state, the number of bits taking 1 in SELC1[3:0] and SELC2[3:0] is the same. When SELC[15:0] is in State 2, it is represented as SELC[15:0]=(0110)$_i$, where i represents the number of bits taking 1 in SELC1[3:0] and SELC2[3:0].

(3) State 3
SELC0[3:0]=every bit is 0
SELC1[3:0]=every bit is 0
SELC2[3:0]=at least one bit is 1
SELC3[3:0]=at least one bit is 1

In this state, the number of bits taking 1 in SELC2[3:0] and SELC3[3:0] is the same. When SELC[15:0] is in State 3, it is represented as SELC[15:0]=(1100)$_i$, where i represents the number of bits taking 1 in SELC2[3:0] and SELC3[3:0].

(4) State 4
SELC0[3:0]=at least one bit is 1
SELC1[3:0]=every bit is 0
SELC2[3:0]=every bit is 0
SELC3[3:0]=at least one bit is 1

In this state, the number of bits taking 1 in SELC0[3:0] and SELC3[3:0] is the same. When SELC[15:0] is in State 4, it is represented as SELC[15:0]=(1001)$_i$, where i represents the number of bits taking 1 in SELC0[3:0] and SELC3[3:0].

According to the value of i mentioned above, the slew rate of the phase selection circuit 12 varies even in the same state. When i=1, the slew rate becomes minimum (Min), and increases as the value of i increases, and reaches maximum (Max) when i=4.

To the control terminal SEL2, a 16-bit PI selection signal SELP[15:0] is input. The format of the PI selection signal SELP[15:0] is a thermometer code.

From the clock output terminal OUT0, OUT0B, OUT1, and OUT1B, multiphase clocks are output. Relative to the phase of a clock output from the clock output terminal OUT0, the phase of a clock output from the clock output terminal OUT1 is shifted by 90°. Further, the phase of a clock output from the clock output terminal OUT0B is shifted by 180° relative to that of the clock output from the clock output terminal OUT0. Similarly, the phase of a clock output from the clock output terminal OUT1B is shifted by 180° relative to that of the clock output from the clock output terminal OUT1.

The buffer circuit 11-1 receives reference clocks of 0° and 180° from the input terminals IN0 and IN0B, and outputs them as reference clocks of 0° and 180° of the system-0 to the phase selection circuit 12. The buffer circuit 11-2 receives reference clocks of 0° and 180° from the input terminals IN0 and IN0B, and outputs them as reference clocks of 0° and 180° of the system-1 to the phase selection circuit 12. The buffer circuit 11-3 receives reference clocks of 90° and 270° from the input terminals IN1 and IN1B, and outputs them as reference clocks of 90° and 270° of the system-0 to the phase selection circuit 12. The buffer circuit 11-4 receives reference clocks of 90° and 270° from the input terminals IN1 and IN1B, and outputs them as reference clocks of 90° and 270° of the system-1 to the phase selection circuit 12. These buffer circuits 11-1 to 11-4 are provided for preventing propagation of switching noise which may be caused when switching input reference clocks in the phase selection circuit 12. As such, in the case where the effect of switching noise is small, the buffer circuits 11-1 to 11-4 may be omitted.

The phase selection circuit 12 selects reference clocks to be input to the phase interpolation circuits 13-1, 13-2 in the latter stage, among the reference clocks of the system-0 and the system-1 according to the phase selection signal SELC[15:0]. Selection of reference clocks by the phase selection circuit 12 is performed such that two reference clocks having phases shifted by 90° from each other are input to the respective phase interpolation circuits 13-1, 13-2. Further, the phase selection circuit 12 is also a variable slew rate circuit in which a slew rate varies according to the value of i, described above, of the phase selection signal SELC[15:0].

Figure 2:
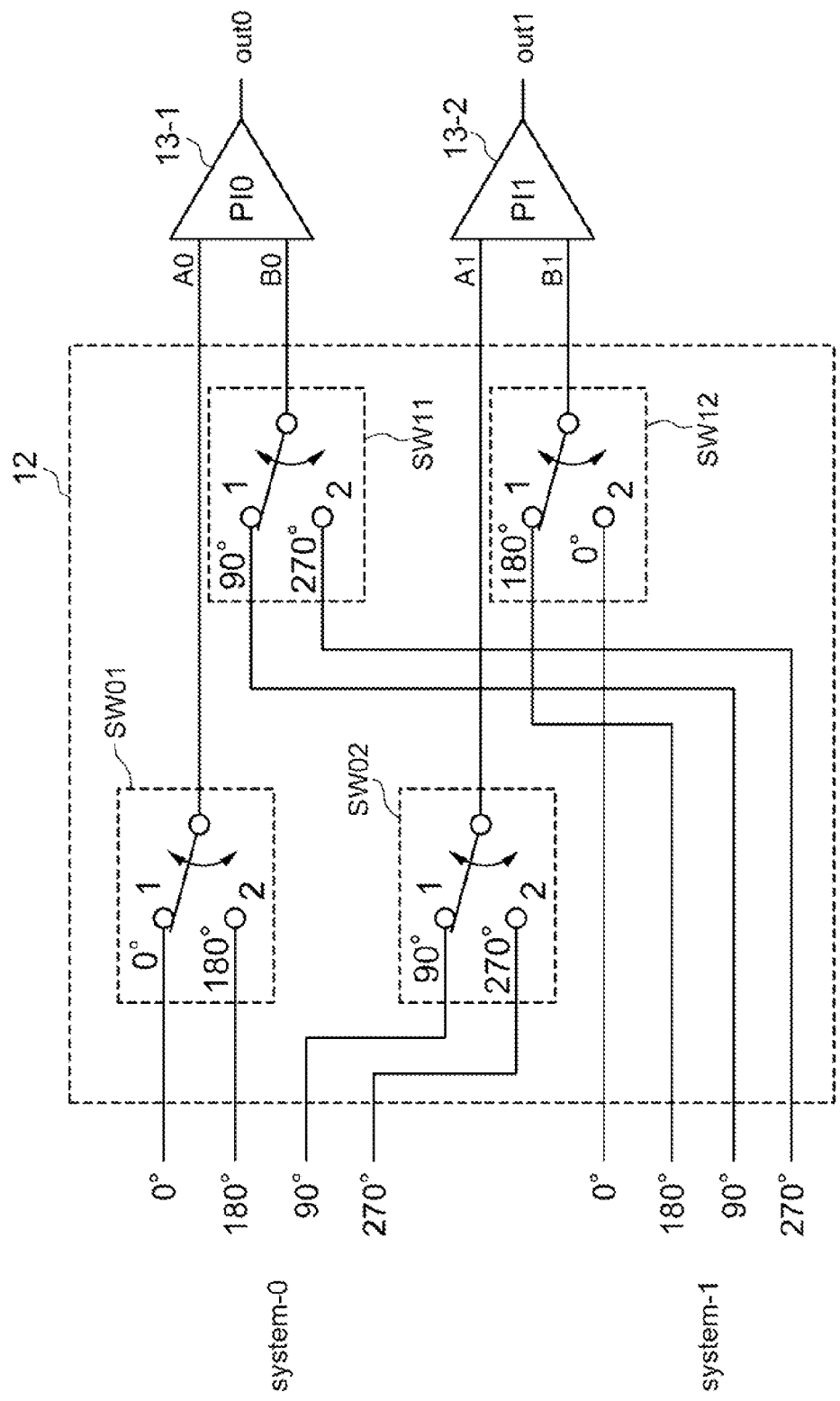
FIG. 2 is a schematic configuration diagram of a phase selection circuit used in the multiphase clock diagram of the present invention.

FIG. 2 is a diagram showing a schematic configuration of the phase selection circuit 12. The phase selection circuit 12 includes two selection switches SW01 and SW02 for the system-0 and two selection switches SW11 and SW12 for the system-1. The selection switch SW01 selects either one of the two reference clocks of 0° and 180° of the system-0, and inputs it to a terminal A0 of the phase interpolation circuit 13-1. The selection switch SW02 selects either one of the two reference clocks 90° and 270° of the system-0, and inputs it to a terminal A1 of the phase interpolation circuit 13-2. The selection switch SW11 selects either one of the two reference clocks 90° and 270° of the system-1, and inputs it to a terminal B0 of the phase interpolation circuit 13-1. The selection switch SW12 selects either one of the two reference clocks 0° and 180° of the system-1, and inputs it to a terminal B1 of the phase interpolation circuit 13-2.

Figure 3:
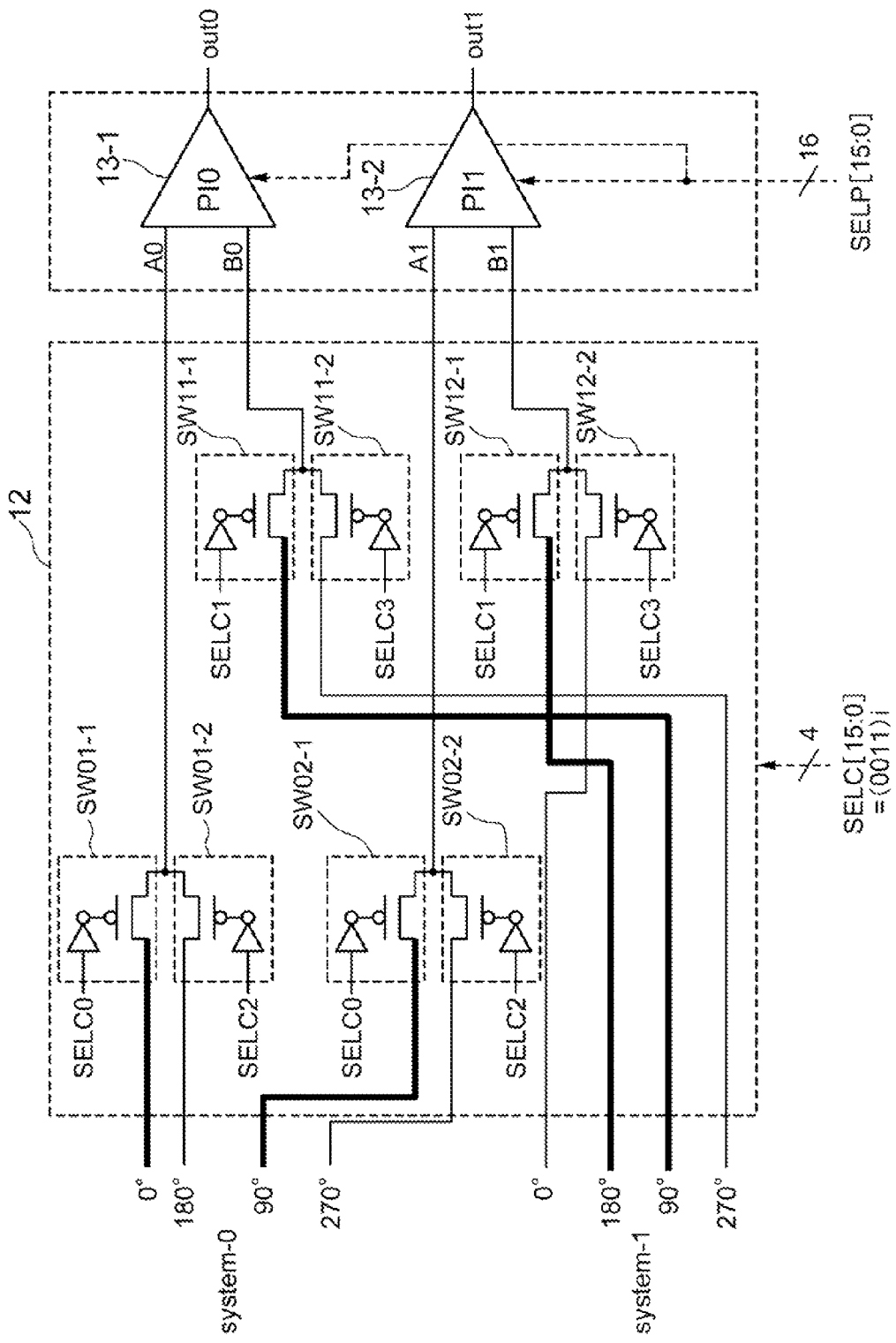
FIG. 3 is a diagram showing more specific configuration and operation of the phase selection circuit used in the multiphase clock diagram of the present invention.

Each of the selection switches SW01, SW02, SW11, and SW12 of the phase selection circuit 12 is formed of a combination of two switches, as shown in FIG. 3.

A switch SW01-1 and a switch SW01-2 shown in FIG. 3 constitute the selection switch SW01 in FIG. 2. The switch SW01-1 is controlled to be on and off by the phase selection signal SELC0[3:0], and the switch SW01-2 is controlled to be on and off by the signal phase selection signal SELC2[3:0].

A switch SW02-1 and a switch SW02-2 shown in FIG. 3 constitute the selection switch SW02 in FIG. 2. The switch SW02-1 is controlled to be on and off by the phase selection signal SELC0[3:0], and the switch SW02-2 is controlled to be on and off by the phase selection signal SELC2[3:0].

A switch SW11-1 and a switch SW11-2 shown in FIG. 3 constitute the selection switch SW11 in FIG. 2. The switch SW11-1 is controlled to be on and off by the phase selection signal SELC1[3:0], and the switch SW11-2 is controlled to be on and off by the phase selection signal SELC3[3:0].

A switch SW12-1 and a switch SW12-2 shown in FIG. 3 constitute the selection switch SW12 in FIG. 2. The switch SW12-1 is controlled to be on and off by the phase selection signal SELC1[3:0], and the switch SW12-2 is controlled to be on and off by the phase selection signal SELC3[3:0].

Figure 4:
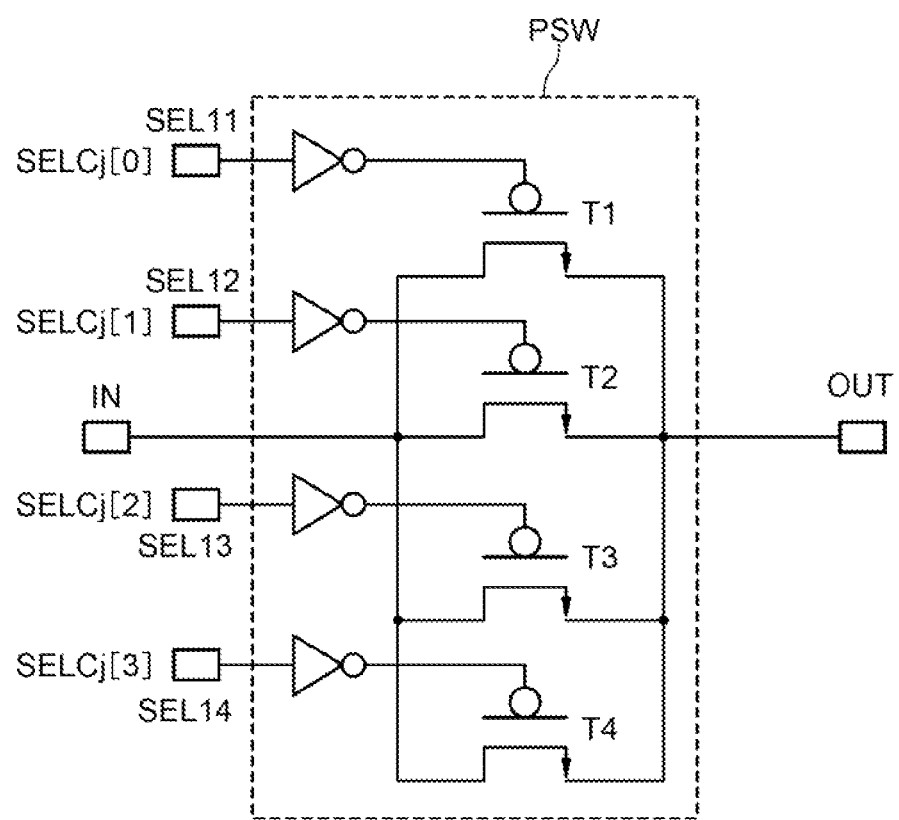
FIG. 4 is a circuit diagram of a switch used in the phase selection circuit in the multiphase clock generation circuit of the present invention.

Each of the respective switches SW01-1, SW01-2, SW02-1, SW02-2, SW11-1, SW11-2, SW12-1, and SW12-2 actually has a configuration similar to that of a switch PSW shown FIG. 4. The switch PSW is formed of a circuit in which four pass transistors T1 to T4 are connected in parallel. Each of the pass transistors T1 to T4 is formed of a pMOS transistor. The sources of the four pMOS transistors are connected to a common input terminal IN and the drains of the four pMOS transistors are connected to a common output terminal OUT, while the gates of the four pMOS transistors are respectively connected to different control terminals SEL11, SEL12, SEL13, and SEL14.

To the four control terminals SEL11, SEL12, SEL13, and SEL14, values of different bits of one phase selection signal SELCj[3:0] are input, respectively. In this exemplary embodiment, j takes any one of 0, 1, 2, and 3. For example, if the switch PSW of FIG. 4 corresponds to the switch SW01-1 of FIG. 3, values of different bits of the phase selection signal SELC0[3:0] are input to the respective control terminals SEL11, SEL12, SEL13, and SEL14. When a value 1 is applied to the gate via the control terminals, the pass transistors T1 to T4 are turned on, while when a value 0 is applied to the gates, the pass transistors T1 to T4 are turned off. When all of the four pass transistors T1 to T4 are turned on, the on resistance of the switch PSW becomes Min. When the on resistance of the switch PSW is Min, the slew rate determined by the time constant of the RC of the switch PSW becomes Max. If only one pass transistor T1 is turned on, as the on resistance of the switch PSW becomes one quarter assuming that the on resistance of all pass transistors T1 to T4 is the same, the slew rate of the switch PSW becomes Min. As the four pass transistors T1 to T4 can be turned on and off independently, the slew rate of the switch PSW is able to be switched in four stages.

Figure 5:
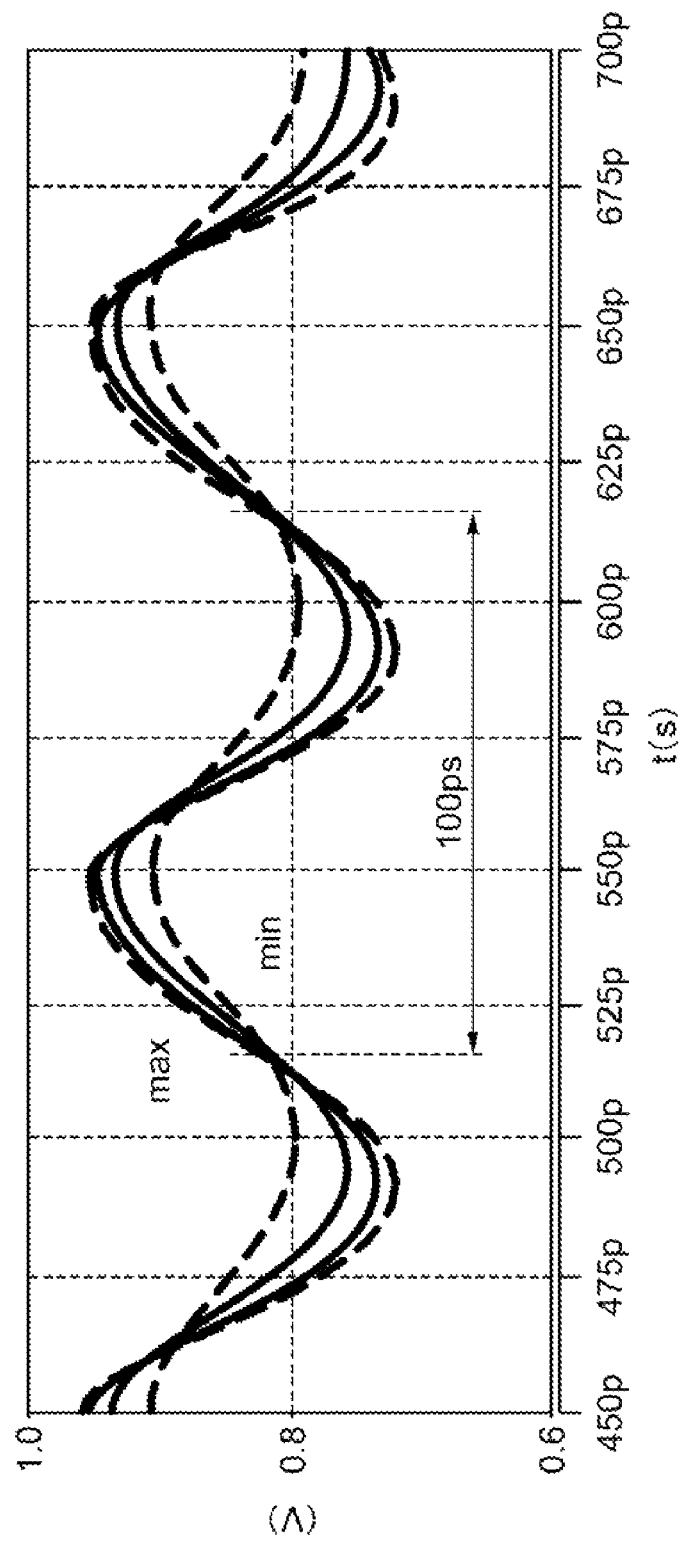
FIG. 5 is a graph showing a simulation result of output waveforms when the on resistance of a switch used in the phase selection circuit is switched in four stages.

FIG. 5 shows a simulation result of waveforms output from the output terminal OUT when a signal of 10 GHz is input to the imputer terminal IN of the switch PSW, obtained by changing the number of pass transistors T1 to T4 to be turned on simultaneously from one to four. The output waveforms differ according to the number of pass transistors T1 to T4 in an on state. This means that the slew rate of the switch PSW varies according to the number of pass transistors T1 to T4 turned on simultaneously.

Each of the phase interpolation circuits 13-1 and 13-2 is a circuit which interpolates two reference clocks having phases shifted by 90° from each other, and generates a clock having an intermediate phase. Each of the phase interpolation circuits 13-1 and 13-2 generates sixteen phases (sixteen steps), including the phases which are the same as those of the two reference clocks. A phase to be generated, among the sixteen phases, is controlled by the 16-bit PI selection signal SELP [15:0]. The resolution of the output phase in this case is 90°/16=5.6°. As such, assuming that the frequency of the reference clock is 10 GHz, the timing of an output clock can be adjusted at intervals (STEP) of 100 ps×5.6°/360°=1.56 ps.

Figure 6:
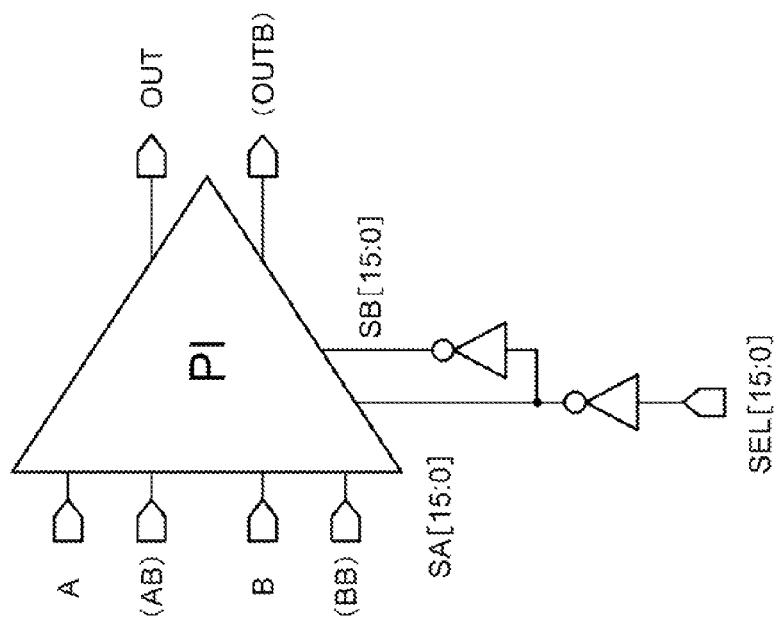
FIG. 6 is an illustration of terminals of the multiphase clock generation circuit of the present invention and input/output waveforms.
Figure 6:
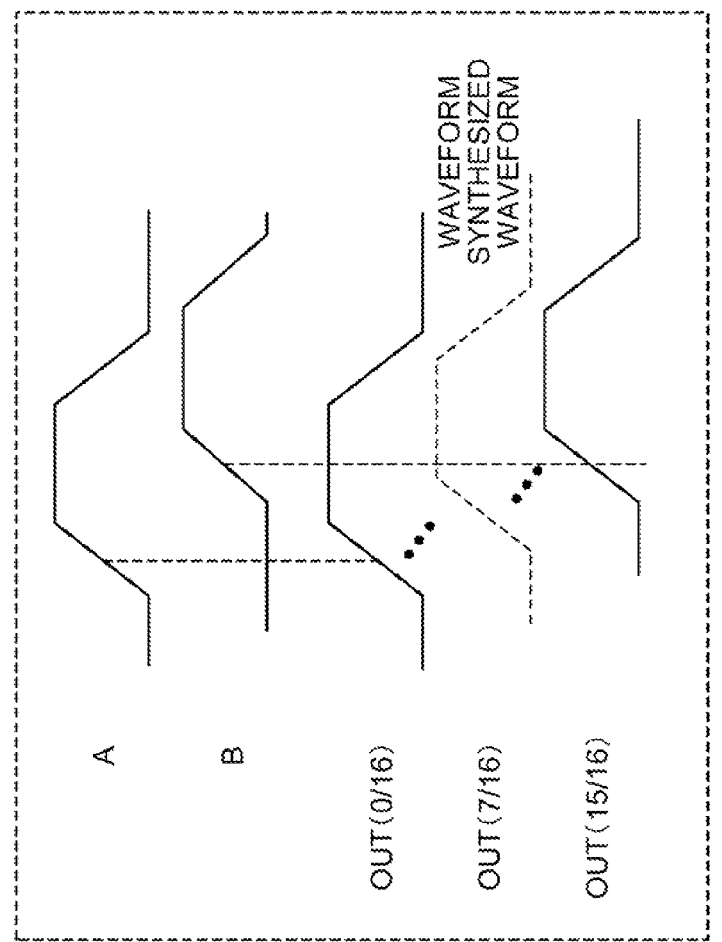

FIG. 6 shows an example in which a basic circuit of a phase interpolation circuit is formed of a CML (Current Mode Logic). In the phase interpolation circuit of this example, clocks having phases shifted by 90° from each other are input to an imputer terminal A(AB) and an input terminal B(BB). Further, a 16-bit PI selection signal SELP[15:0] is divided into control bits SA and SB, each having 16 bits, and a clock having a phase selected by these control bits SA and SB is output from an output terminal OUT (OUTB). It should be noted that the control bit SA and the control bit SB have inverted bit values. Further, an input terminal A and an input terminal AB, an input terminal B and an input terminal BB, and an output terminal OUT and an output terminal OUTB, respectively have a relationship of inputting or outputting signals of inverted phases.

Figure 7:
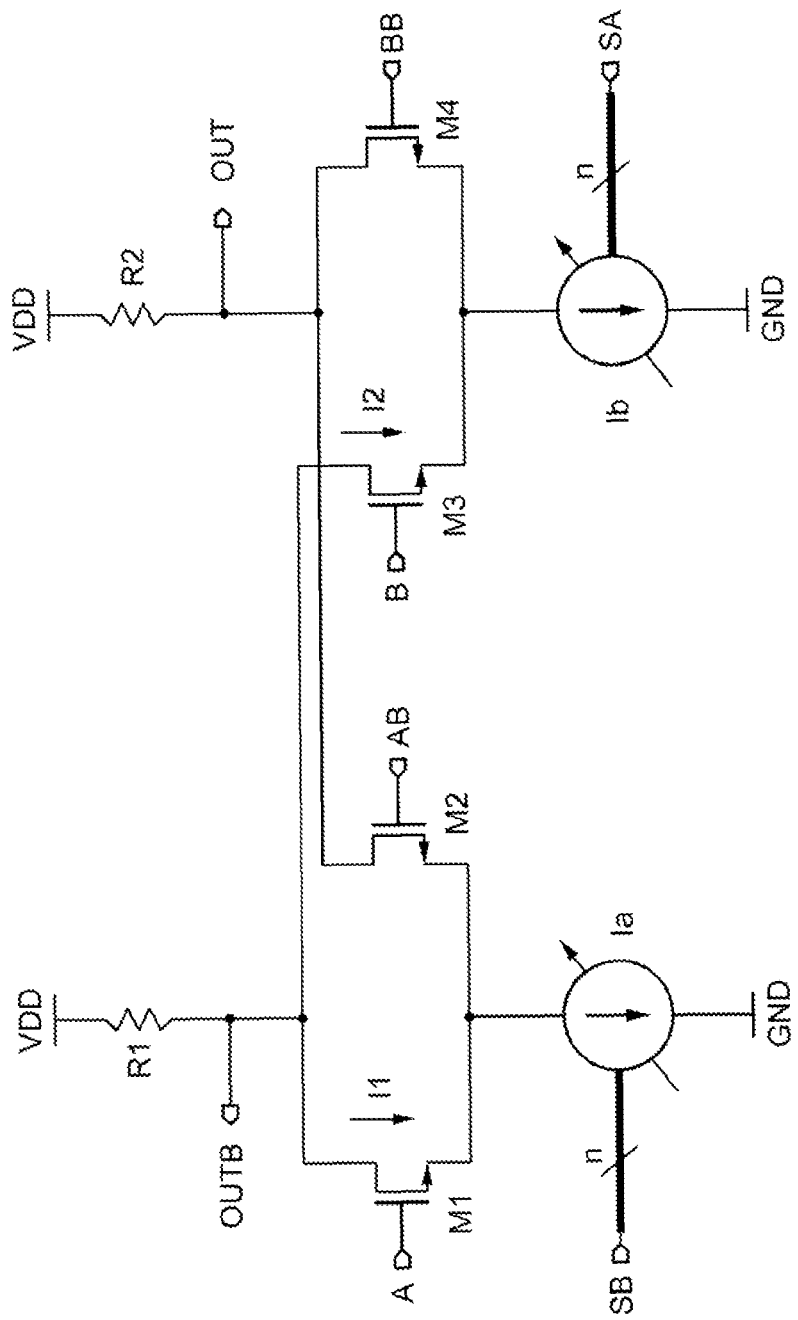
FIG. 7 is a circuit diagram showing a phase interpolation circuit used in the multiphase clock generation circuit of the present invention.

FIG. 7 shows an exemplary internal configuration of the phase interpolation circuit of FIG. 6. The phase interpolation circuit of this example includes first to fourth MOS transistors M1 to M4, first and second resistance R1 and R2, and first and second current sources Ia and Ib. The first and third MOS transistors M1 and M3 share the source and are connected to a power source potential VDD via the resistance R1. The second and fourth MOS transistors M2 and M4 share the source, and are connected to a power source potential VDD via the resistance R2. The first and second MOS transistors M1 and M2 share the drain, and are connected to the current source Ia. The third and fourth MOS transistors M3 and M4 share the drain, and are connected to the current source Ib.

Further, the gate of the first MOS transistor M1 is connected to the input terminal A, the gate of the second MOS transistor M2 is connected to the input terminal AB, the gate of the third MOS transistor M3 is connected to the input terminal B, and the gate of the fourth MOS transistor M4 is connected to the input terminal BB. Further, the circuit is adapted such that the current source Ia is applied with the control bit SB via the control terminal, and the current source Ib is applied with the control bit SA via the control terminal. Further, the output terminal OUT is connected between the shared source of the second and fourth MOS transistors M2 and M4 and the resistance R2, and the output terminal OUTB is connected between the shared source of the first and third MOS transistors M1 and M3 and the resistance R1.

Figure 8:
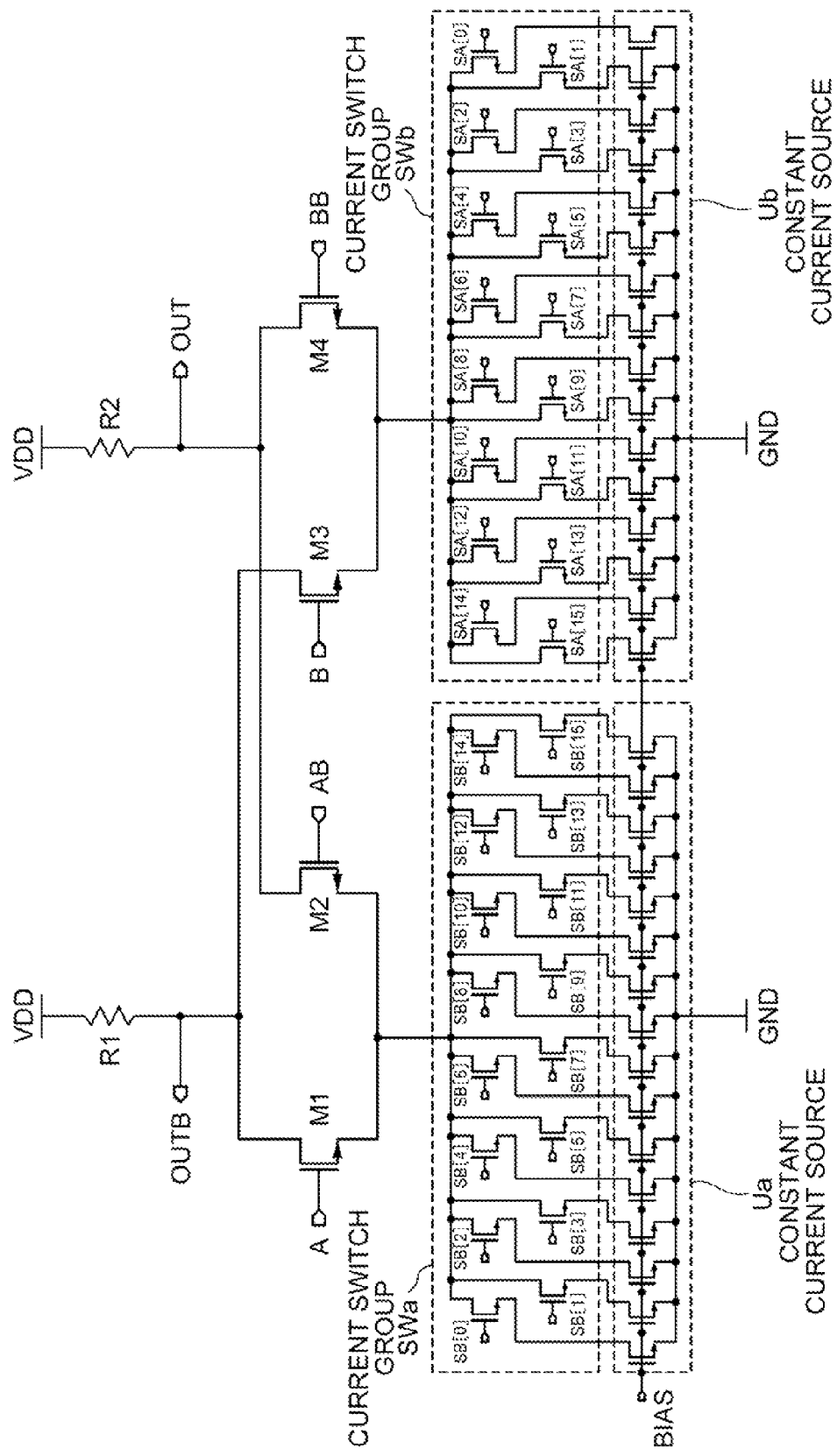
FIG. 8 is a detailed circuit diagram showing the phase interpolation circuit used in the multiphase clock generation circuit of the present invention.

FIG. 8 shows an exemplary internal configuration of the current sources Ia and Ib of FIG. 7. The current source Ia in this example includes a constant current source Ua consisting of sixteen current source units, and a current switch group SWa consisting of sixteen current switches for controlling on and off of the respective current source units. The respective current switches of the current switch group SWa and the respective bits of the control bit SB correspond to each other one to one, and the respective current switches turn on the current source units when the value of the corresponding bit is 1, and turn off when the value is 0. Further, the current source Ib includes a constant current source Ub consisting of sixteen current source units, and a current switch group SWb consisting of sixteen current switches for controlling on and off of the respective current source units. The respective current switches of the current switch group SWb and the respective bits of the control bit SA correspond to each other one to one, and the respective current switches turn on the current source units when the value of the corresponding bit is 1, and turn off when the value is 0.

In the phase interpolation circuit shown in FIGS. 6 to 8, the amplitude of a current I1 flowing in the current source Ia side and the amplitude of a current I2 flowing in the current source Ib side are controlled by the control bits SA and SB, and the sum thereof is maintained constant. Further, the potential of the output terminal OUT is determined by the sum of the current flowing in the second MOS transistor M2 and the current flowing in the fourth MOS transistor M4, and the potential of the output terminal OUTB is determined by the sum of the current flowing in the first MOS transistor M1 and the current flowing in the third MOS transistor M3. As such, when clocks having phases shifted by 90° from each other are input to the input terminals A(AB) and B(BB), a clock having a phase determined by the control bits SA and SB is to be output from the output terminal OUT(OUTB). It should be noted that as the principle of operation of the phase interpolation circuit is described in Non-Patent Document 2, the detailed description thereof is omitted herein.

Next, the overall operation of the multiphase clock generation circuit 12 of the present invention will be described.

If the phase selection signal SELC[15:0] is (0011)$_i$, regardless of the value of i, the phase selection circuit 12 selects a reference clock of 0° of the system-0 input and a reference clock of 90° of the system-1 input and inputs them to the input terminals A0 and B0 of the phase interpolation circuit 13-1, and selects a reference clock of 90° of the system-0 input and a reference clock of 180° of the system-1 input and inputs them to the input terminals A1 and B10 of the phase interpolation circuit 13-2, as shown in FIG. 3. The phase interpolation circuits 13-1 and 13-2 outputs a clock generated by interpolating the two input clocks according to the PI selection signal SELP[15:0] from the output terminal OUT0 and the output terminal OUT1.

If the phase selection signal SELC[15:0] is in the state of (0011)$_i$ and the PI selection signal SELP[15:0] is 0 (=0/64), as all ratios of the current within the phase interpolation circuit are selections on the A side ("A:16, B:0"), input waveforms of A and B are not synthesized. Consequently, the reference clock of 0° of the system-0 input is directly output from the output OUT0 of the phase interpolation circuit 13-1, and a reference clock of 90° of the system-0 input is directly output from the output OUT1 of the phase interpolation circuit 13-2.

If the phase selection signal SELC[15:0] remains (0011)$_i$, while the PI selection signal SELP[15:0] selects 1 (=1/64), as the ratio of the current in the phase interpolation circuit becomes "A:15, B:1", the input waveforms of A and B are synthesized at the ratio of A:B=15:1. Consequently, a clock having a phase delayed by 1 STEP (5.6°) from the reference clock of 0° of the system-0 input is output from the output OUT0 of the phase interpolation circuit 13-1, and a clock having a phase delayed by 1 STEP (5.6°) from the reference clock of 90° of the system-0 input is output from the output OUT1 of the phase interpolation circuit 13-2. As such, a clock delayed by 1 STEP, with respect to the output clock at the time of SELP=0, is output.

If the phase selection signal SELC[15:0] remains at (0011)$_i$, while the PI selection signal SELP[15:0] selects 2 (=2/64), as the ratio of the current in the phase interpolation circuit becomes "A:14, B:2", the input waveforms of A and B are synthesized at a ratio of A:B=14:2. Consequently, a clock having a phase delayed by 2 STEP (11.2°) from the reference clock of 0° of the system-0 input is output from the output OUT0 of the phase interpolation circuit 13-1, and a clock having a phase delayed by 2 STEP (11.2°) from the reference clock of 90° of the system-0 input is output from the output OUT1 of the phase interpolation circuit 13-2.

Similarly, the delay is increased by 1 STEP until the PI selection signal SELP[15:0] selects 15 (=15/64) while the phase selection signal SELC[15:0] maintains (0011)$_i$.

Figure 9:
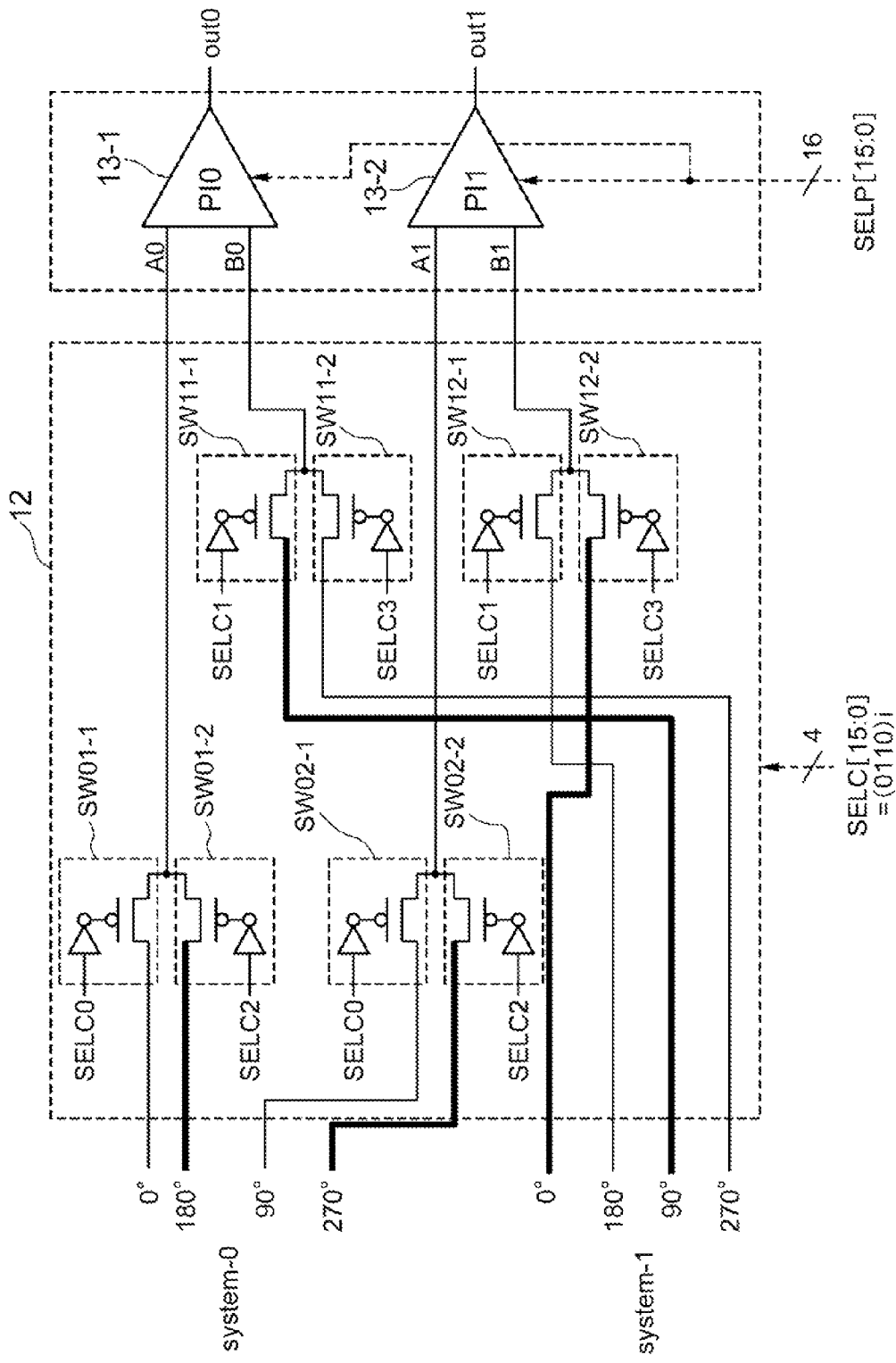
FIG. 9 is an illustration of operation of the phase selection circuit used in the multiphase clock generation circuit of the present invention.

If the PI selection signal SELP[15:0] selects 16 (=16/64) while the phase selection signal SELC[15:0] maintains (0011)$_i$, as the ratio of the current in the phase interpolation circuit becomes "A:0, B:16", the input waveforms of A and B will not be synthesized. Consequently, a reference clock of 90° of the system-1 input is directly output from the output OUT0 of the phase interpolation circuit 13-1, and a reference clock of 180° of the system-1 input is directly output from the output OUT1 of the phase interpolation circuit 13-2. In that case, in order to prepare for the next phase, the phase selection signal SELC[15:0] is switched from (0011)$_i$ to (0110)$_i$. Thereby, the state of the phase selection circuit is switched from the state shown in FIG. 3 to the state shown in FIG. 9, regardless of the value of i. As such, in the system-0, the reference clock of 180° is input to the input terminal A0 of the phase interpolation circuit 13-1 in place of the reference clock of 0°, and the reference clock of 270° is input to the input terminal A1 of the phase interpolation circuit 13-2 in place of the reference clock of 90°. In the state where the PI selection signal SELP[15:0] selects 16 (=16/64), as the input waveform of A is not used, there is no effect on the outputs of the phase interpolation circuits 13-1 and 13-2.

If the PI selection signal SELP[15:0] selects 17 (=17/64) while the phase selection signal SELC[15:0] maintains (0110)$_i$, the ratio of the current in the phase interpolation circuit becomes "A:1, B:15". In the state where the phase selection signal SELC[15:0] is (0110)$_i$, as the phase selection circuit is in the state shown in FIG. 9, the input waveform of A (reference clock of 180°) and the input waveform of B (reference clock of 90°) are synthesized at the ratio of A:B=1:15. Consequently, a clock having a phase delayed by 1 STEP (5.6°) from the reference clock of 90° is output from the output OUT0 of the phase interpolation circuit 13-1, and a clock having a phase delayed by 1 STEP (5.6°) from the reference clock of 180° is output from the output OUT1 of the phase interpolation circuit 13-2.

Figure 10:
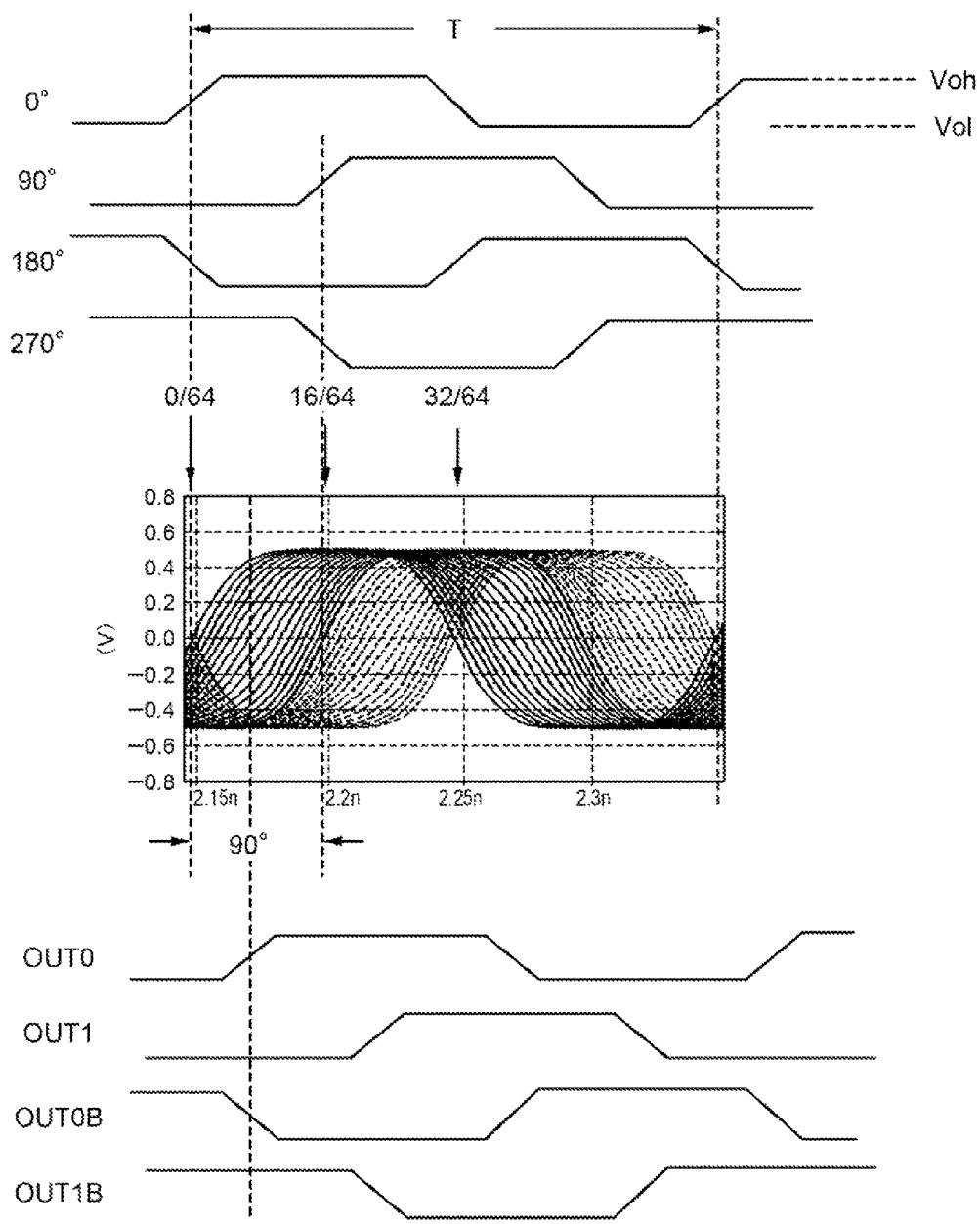
FIG. 10 is an illustration showing variations of input waveforms and output waveforms of the multiphase clock generation circuit of the present invention.

As described above, with the delay changes per 1 STEP by the PI selection signal SELP[15:0] and switching of phase combinations per 16 STEP, the phase (delay) of the output clock can be switched at 5.6° intervals over 360°, as shown in FIG. 10. When the phase of the output clock is switched at 5.6° intervals over 360°, the phase selection signal SELC[15:0] and the PI selection signal SELP[15:0] transit according to the combination patterns shown in FIG. 11. The description of the overall operation of the multiphase clock generation circuit 12 ends.

Next, operation relating to slew rate control will be described.

The phase selection circuit 12 of the multiphase clock generation circuit of the present embodiment supplies reference clocks to the phase interpolation circuits 13-1 and 13-2 in the latter stage via the switch PSW having a variable slew rate function, as shown in FIG. 4. As such, by changing the slew rate of the switch PSW, waveforms of the reference clocks to be input to the phase interpolation circuits 13-1 and 13-2 can be changed.

Figure 12:
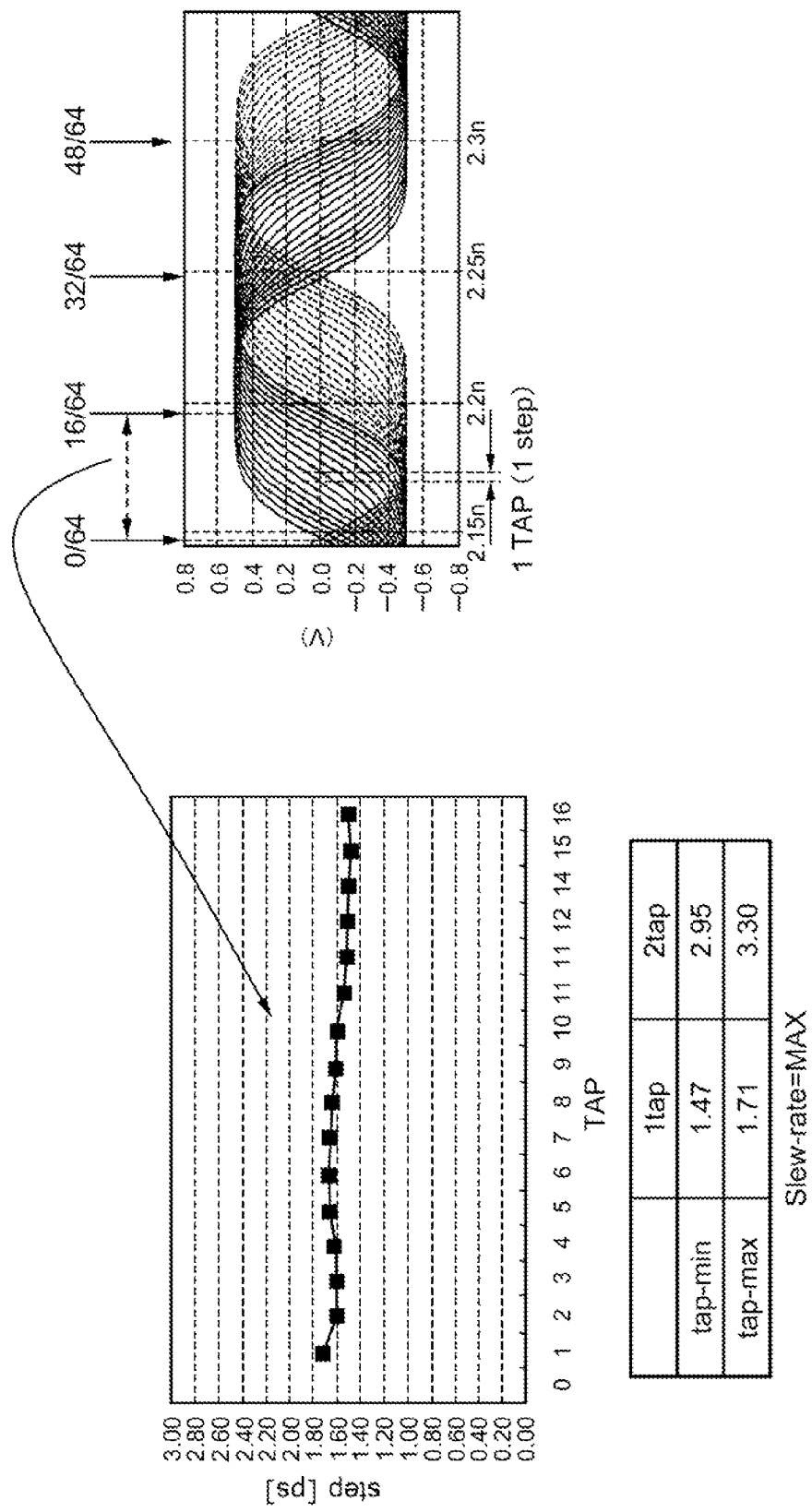
FIG. 12 is a characteristic graph showing the phase change amount per 1 STEP when the multiphase clock generation circuit of the present invention is operated at 10 GHz.

In the multiphase clock generation circuit 10 of the present embodiment, an optimization design is performed on a condition that the slew rate is Max when the clock frequency is 10 GHz. FIG. 12 is a characteristic graph obtained by simulating a part of change in STEP (unit change amount) when the phase interpolation circuit is changed in 16 stages. The horizontal axis indicates a SELP selection signal showing 16 stages from 0/64~16/64, and the vertical axis indicates the STEP amount (unit change amount). This characteristic graph indicates that as the amount of STEP is more constant, the delay is controlled to be more constant, that is, the performance (design) is better. An ideal STEP at the time of operation at 10 GHz is an interval of 100[ps]*5.6°/360°=1.56 ps (average value). In the characteristic graph of FIG. 12, almost constant values are obtained around 1.56 ps.

Figure 13:
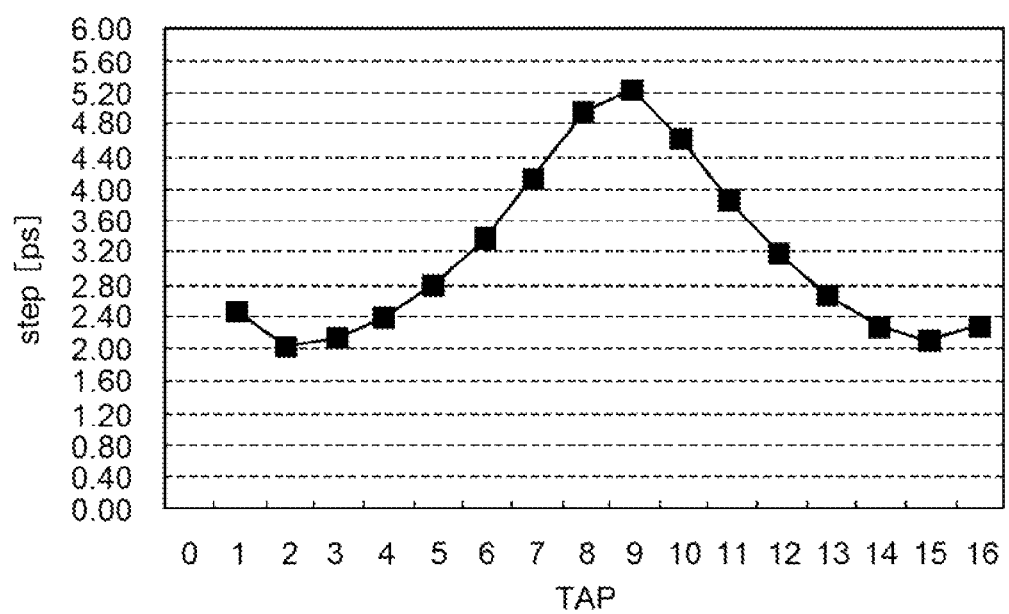
FIG. 13 is a characteristic graph showing the phase change amount per 1 STEP when the multiphase clock generation circuit of the present invention is operated at 5 GHz with the slew rate being maximum.

FIG. 13 shows a characteristic graph in the case where the clock frequency is lowered to 5 GHz while the slew rate is maintained at Max. Compared with the characteristic graph of the operation at 10 GHz shown in FIG. 12, the amount of STEP is not constant, and the value of 1 STEP varies widely. This is because as the frequency of the clock to be input to the phase interpolation circuit is lowered to a half, rising of the waveform becomes faster, so that it is deviated from the optimized waveform rounding.

Figure 14:
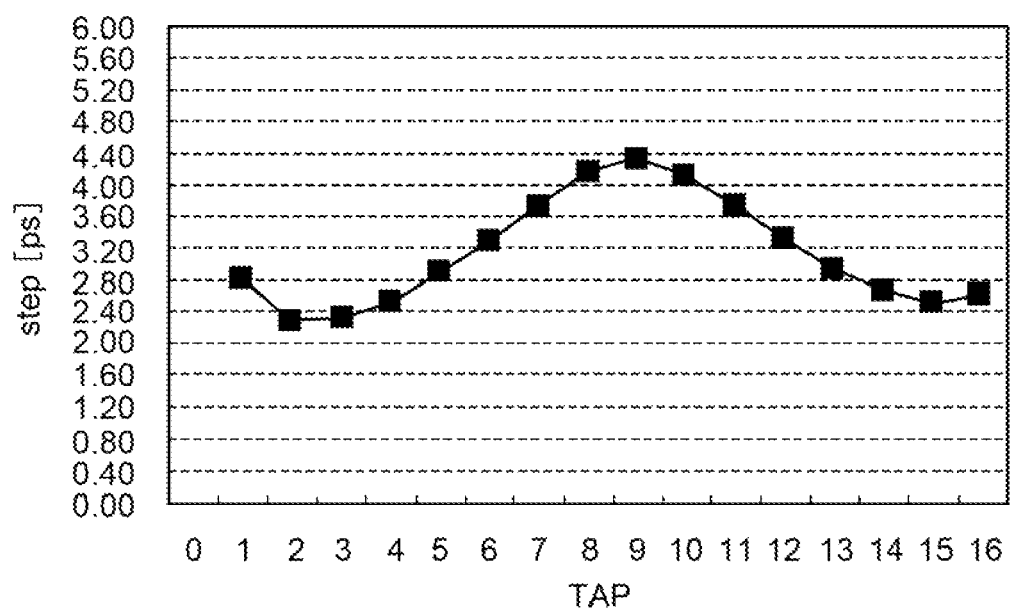
FIG. 14 is a characteristic graph showing the phase change amount per 1 STEP when the multiphase clock generation circuit of the present invention is operated at 5 GHz with the slew rate being minimum.

On the other hand, FIG. 14 shows a characteristic graph in the case where the input clock frequency is lowered to 5 GHz with the slew rate being Min. As the waveform is more rounded compared with the case where the slow rate is Max, variations in the value of 1 STEP are reduced, and so it is found that the capability is improved compared with the case shown in FIG. 13.

Figure 15:
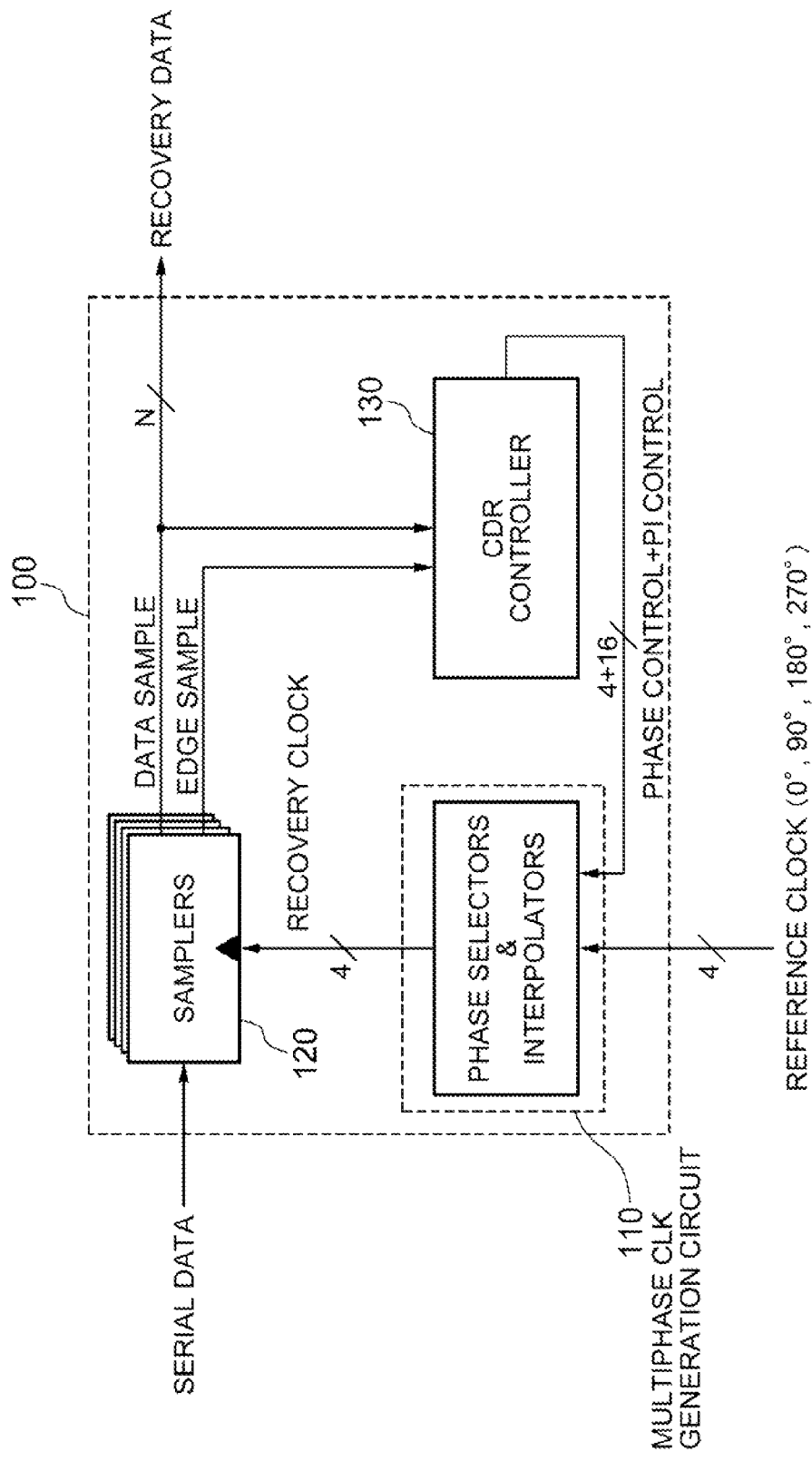
FIG. 15 is a block diagram showing an example of a clock data recovery circuit.
Figure 16:
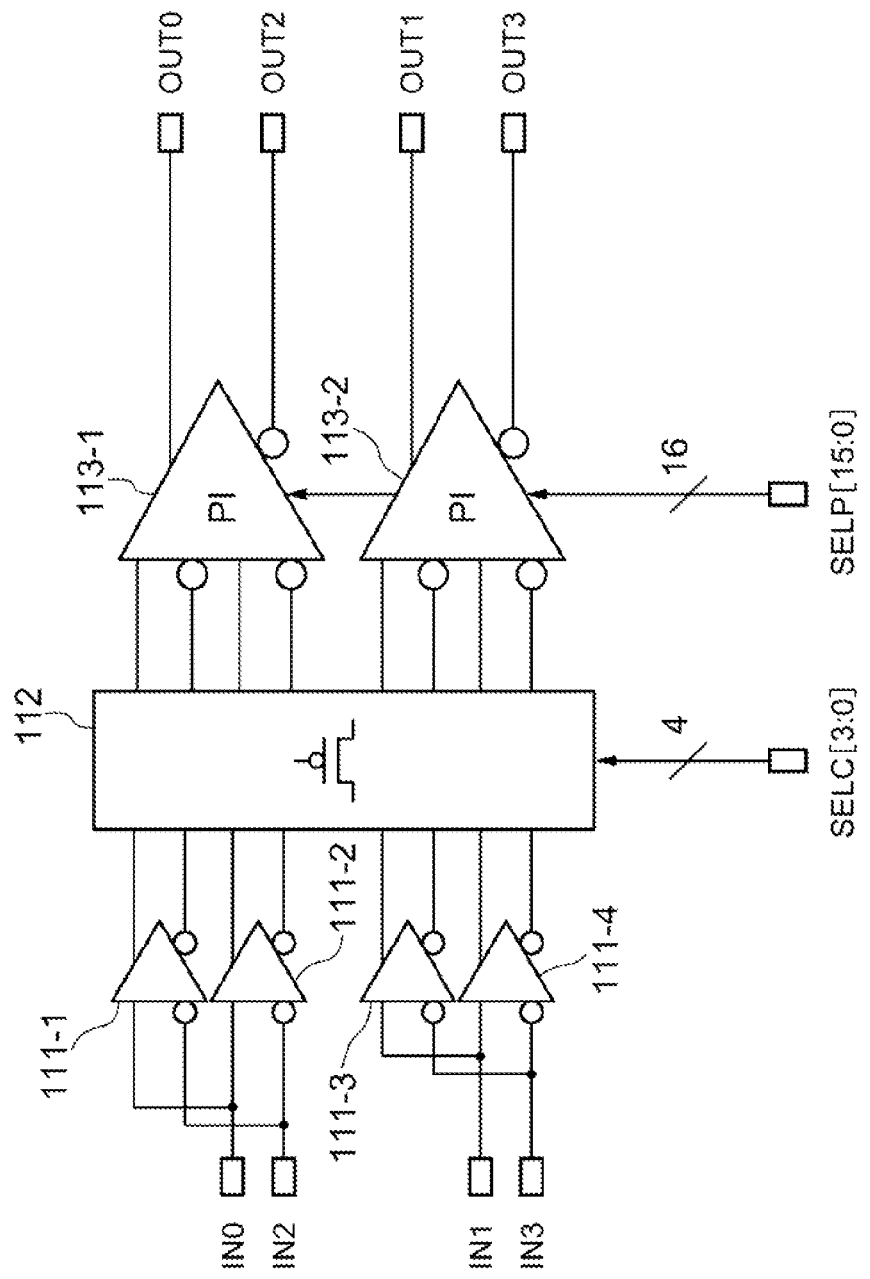
FIG. 16 is a block diagram showing a multiphase clock generation circuit related to the present invention.
Figure 17:
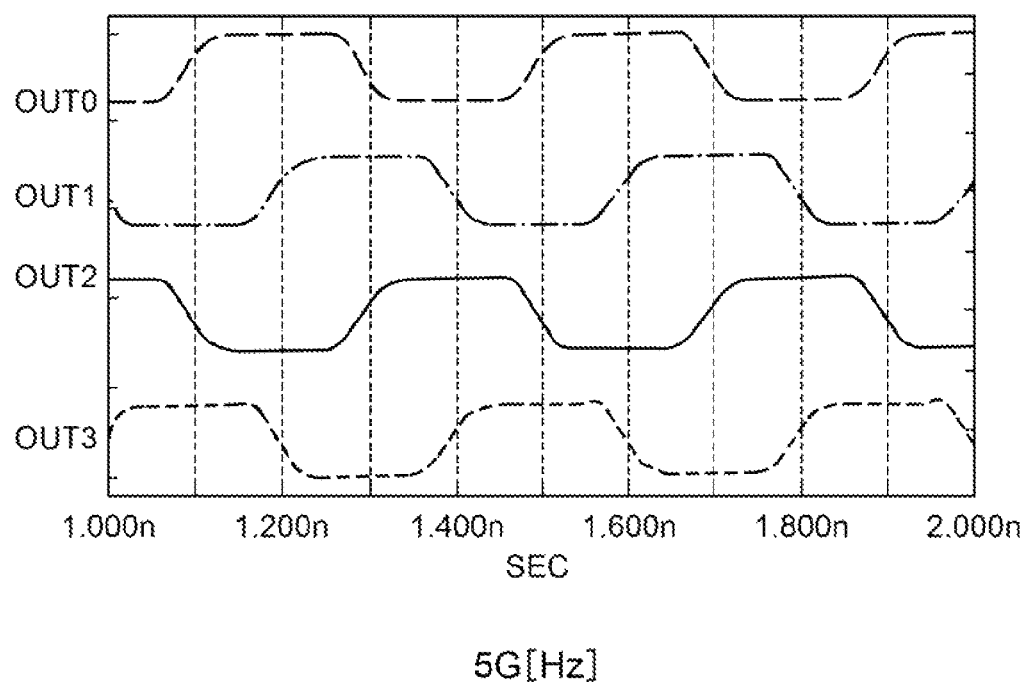
FIG. 17 is a graph showing a simulation result of output clock waveforms when a multiphase clock generation circuit related to the present invention is operated at a frequency of 5 GHz.
Figure 18:
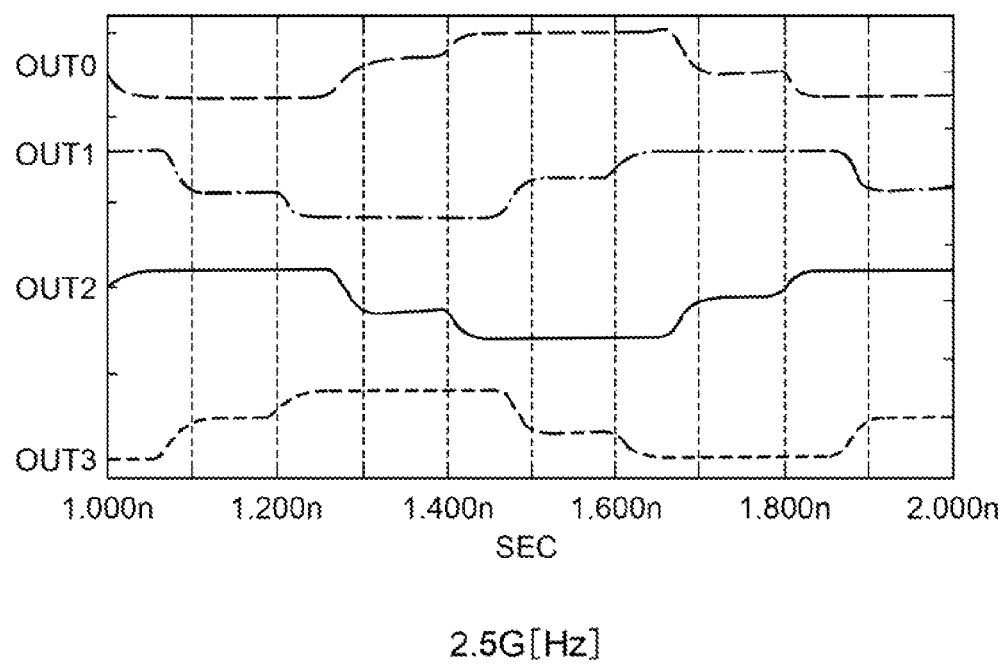
FIG. 18 is a graph showing a simulation result of output clock waveforms when a multiphase clock generation circuit related to the present invention is operated at a frequency of 2.5 GHz.

As described above, according to the multiphase clock generation circuit 10 of the present embodiment, as reference clocks are input to the phase interpolation circuits 13-1 and 13-2 in the latter stage via the variable slew rate circuit (phase selection circuit 12), by switching the slew rate of the variable slew rate circuit according to the operating frequency, optimum input waveforms can be input to the phase interpolation circuits 13-1 and 13-2 over a wide operating frequencies. As such, accuracy of phase interpolation and accuracy of multiphase clock to be generated are improved. Further, by using the multiphase clock generation circuit 10 of the present invention as a multiphase clock generation circuit 110 of the CDR circuit 100 shown in FIG. 15, sampling accuracy of the SDR circuit is improved.

Further, according to the multiphase clock generation circuit 10 of the present embodiment, as the switches in the phase selection circuit 12 are variable slew rate circuits, an increase in the circuit area and the power consumption can be suppressed, compared with the case of providing variable slow rate circuits separately from the phase selection circuit 12.

Further, in the multiphase clock generation circuit 10 of the present embodiment, as the variable slew rate circuits consist solely of pMOS transistors, an increase in the circuit area and power consumption can be suppressed as much as possible.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

For example, although, the ratios of W/L of the four pMOS transistors shown in FIG. 4 constituting the slew rate circuit are the same in the above embodiment, an improvement can be expected by devising (optimizing) respective ratios of W/L of the four parallel pMOS transistors. Further, although the switching states of the slew rate are four, it may be two or three stages, or may be five stages or more.

Further, although the slew rate circuit has been described as a parallel circuit of pass transistors consisting of pMOS transistors, the slew rate circuit may be formed of a parallel, circuit of a plurality of transfer gates. Further, the slew rate circuit may be formed of a means for changing driving capability by a general CML buffer.

What is claimed is:

1. A multiphase clock generation circuit, comprising:
  a variable slew rate circuit in which a slew rate varies according to a first control signal; and
  a phase interpolation circuit that interpolates two reference clocks according to a second control signal, the two reference clocks having a phase difference of 90° from each other and being input to the phase interpolation circuit through the variable slew rate circuit, to thereby generate an output clock having an intermediate phase.

2. The multiphase clock generation circuit, according to claim 1, wherein
  the variable slew rate circuit includes a plurality of switches for selecting the two reference clocks to be output to the phase interpolation circuit from a plurality of reference clocks having different phases.

3. The multiphase clock generation circuit, according to claim 2, wherein
  an on resistance value of each of the plurality of switches varies according to the first control signal.

4. The multiphase clock generation circuit, according to claim 2, wherein
  the plurality of switches include a parallel circuit of a plurality of pass transistors, and the number of pass transistors to be turned on changes according to the first control signal.

5. The multiphase clock generation circuit, according to claim 4, wherein each of the pass transistors includes a pMOS transistor.

6. The multiphase clock generation circuit, according to claim 2, wherein
  the variable slew rate circuit receives four types of reference clocks of 0°, 90°, 180°, and 270° as system-0 inputs, and four types of reference clocks of 0°, 90°, 180°, and 270° as system-1 inputs, and controls on and off of the switches according to the first control signal, to thereby input two reference clocks having a phase difference of 90° from each other to the phase interpolation circuit.

7. The multiphase clock generation circuit, according to claim 6, wherein
  the first control signal includes $10^{th}$, $11^{th}$, $12^{th}$, and $13^{th}$ control signals of n bits,
  the multiphase clock generation circuit includes a first phase interpolation circuit and a second phase interpolation circuit as the phase interpolation circuits, and
  the variable slew rate circuit includes:
    a first switch for inputting the reference clock of 0° of the system-0 input to one input terminal of the first phase interpolation circuit, on and off of the first switch being controlled according to the $10^{th}$ control signal;
    a second switch for inputting the reference clock of 180° of the system-0 input to the one input terminal of the first phase interpolation circuit, on and off of the second switch being controlled according to the $12^{th}$ control signal;
    a third switch for inputting the reference clock of 90° of the system-0 input to one input terminal of the second phase interpolation circuit, on and off of the third switch being controlled according to the $10^{th}$ control signal;
    a fourth switch for inputting the reference clock of 270° of the system-0 input to the one input terminal of the second phase interpolation circuit, on and off of the fourth switch being controlled according to the $12^{th}$ control signal;
    a fifth switch for inputting the reference clock of 90° of the system-1 input to another input terminal of the first phase interpolation circuit, on and off of the fifth switch being controlled according to the $11^{th}$ control signal;
    a sixth switch for inputting the reference clock of 270° of the system-1 input to the other input terminal of the first phase interpolation circuit, on and off of the sixth switch being controlled according to the $13^{th}$ control signal;
    a seventh switch for inputting the reference clock of 180° of the system-1 input to another input terminal of the second phase interpolation circuit, on and off of the seventh switch being controlled according to the $12^{th}$ control signal; and
    an eighth switch for inputting the reference clock of 0° of the system-1 input to the other input terminal of the second phase interpolation circuit, on and off of the eighth switch being controlled according to the $13^{th}$ control signal.

8. A multiphase clock generation method, comprising:
  adjusting characteristics of rise and fall of waveforms of two reference clocks having a phases difference of 90° from each other; and
  interpolating the adjusted two reference clocks thereby generating an output clock having an intermediate phase.

9. The multiphase clock generation method, according to claim 8, wherein
  the adjusting is performed by allowing the reference clocks to pass through a variable slew rate circuit in which a slew rate varies according to a first control signal.

10. The multiphase clock generation method, according to claim 9, wherein
  the generating is performed using a phase interpolation circuit that interpolates input two reference clocks having a phases difference of 90° from each other according to a second control signal to thereby generate an output clock having an intermediate phase.

11. The multiphase clock generation method, according to claim 9, wherein
the variable slew rate circuit includes a plurality of switches for selecting the two reference clocks to be output to the phase interpolation circuit from a plurality of reference clocks of different phases.

12. The multiphase clock generation method, according to claim 11, wherein
an on resistance value of each of the plurality of switches varies according to the first control signal.

13. The multiphase clock generation method, according to claim 11, wherein
the plurality of switches include a parallel circuit of a plurality of pass transistors, and the number of pass transistors to be turned on changes according to the first control signal.

14. The multiphase clock generation method, according to claim 13, wherein each of the pass transistors includes a pMOS transistor.

15. The multiphase clock generation method, according to claim 11, wherein
the variable slew rate circuit receives four types of reference clocks of 0°, 90°, 180°, and 270° as system-0 inputs, and four types of reference clocks of 0°, 90°, 180°, and 270° as system-1 inputs, and controls on and off of the switches according to the first control signal to thereby input two reference clocks having a phase difference of 90° from each other to the phase interpolation circuit.

16. The multiphase clock generation method, according to claim 15, wherein
the first control signal includes $10^{th}$, $11^{th}$, $12^{th}$, and $13^{th}$ control signals of n bits,
the multiphase clock generation circuit includes a first phase interpolation circuit and a second phase interpolation circuit as the phase interpolation circuits, and
the variable slew rate circuit includes:

a first switch for inputting the reference clock of 0° of the system-0 input to one input terminal of the first phase interpolation circuit, on and off of the first switch being controlled according to the $10^{th}$ control signal;

a second switch for inputting the reference clock of 180° of the system-0 input to one input terminal of the first phase interpolation circuit, on and off of the second switch being controlled according to the $12^{th}$ control signal;

a third switch for inputting the reference clock of 90° of the system-0 input to one input terminal of the second phase interpolation circuit, on and off of the third switch being controlled according to the $10^{th}$ control signal;

a fourth switch for inputting the reference clock of 270° of the system-0 input to one input terminal of the second phase interpolation circuit, on and off of the fourth switch being controlled according to the $12^{th}$ control signal;

a fifth switch for inputting the reference clock of 90° of the system-1 input to another input terminal of the first phase interpolation circuit, on and off of the fifth switch being controlled according to the $11^{th}$ control signal;

a sixth switch for inputting the reference clock of 270° of the system-1 input to another input terminal of the first phase interpolation circuit, on and off of the sixth switch being controlled according to the $13^{th}$ control signal;

a seventh switch for inputting the reference clock of 180° of the system-1 input to another input terminal of the second phase interpolation circuit, on and off of the seventh switch being controlled according to the $12^{th}$ control signal; and an eighth switch for inputting the reference clock of 0° of the system-1 input to another input terminal of the second phase interpolation circuit, on and off of the eighth switch being controlled according to the $13^{th}$ control signal.

* * * * *